(12) United States Patent
Sambucco et al.

(10) Patent No.: US 10,749,507 B1
(45) Date of Patent: Aug. 18, 2020

(54) CURRENT TRIMMING SYSTEM, METHOD, AND APPARATUS

(71) Applicant: Infineon Technologies Austria AG, Villach (AT)

(72) Inventors: Adriano Sambucco, Villach (AT); Emiliano Alejandro Puia, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/445,739

(22) Filed: Jun. 19, 2019

(51) Int. Cl.
*H03K 3/013* (2006.01)
*H03F 3/45* (2006.01)
*H03M 1/12* (2006.01)

(52) U.S. Cl.
CPC ......... *H03K 3/013* (2013.01); *H03F 3/45183* (2013.01); *H03F 2200/375* (2013.01); *H03F 2203/45042* (2013.01); *H03F 2203/45354* (2013.01); *H03M 1/12* (2013.01)

(58) Field of Classification Search
None
See application file for complete search history.

(56) References Cited

U.S. PATENT DOCUMENTS

| 7,209,001 | B2 * | 4/2007 | Ha | G11B 7/1263 330/254 |
| 10,003,304 | B2 * | 6/2018 | Lin | H03F 1/0266 |
| 2012/0001892 | A1 * | 1/2012 | Kojima | H03F 3/3022 345/212 |

* cited by examiner

*Primary Examiner* — Jeffery S Zweizig
(74) *Attorney, Agent, or Firm* — Armis IP Law, LLC

(57) ABSTRACT

A trimming resource includes an adjustable driver resource, a differential voltage generator, and a trim current generator. The adjustable driver resource produces an output signal. The differential voltage generator receives the output signal from the adjustable driver resource and produces a differential drive signal. The trim current generator derives a trim signal from the differential drive signal received from the differential voltage generator. According to one configuration, the trim current generator outputs the trim signal to an electronic component, correcting an operational parameter of the electronic component.

34 Claims, 11 Drawing Sheets

CURRENT TRIMMING SYSTEM, METHOD, AND APPARATUS

BACKGROUND

Conventional trim circuits provide compensation to an electronic circuit. The goal or purpose of a conventional trim circuit is typically to increase an accuracy of a respective circuit by reducing or eliminating a source of error via a respective trim signal.

An example of a trimmable circuit is an operational transconductance amplifier. One source of error associated with an operational transconductance amplifier is the offset current present on the output. If set properly, trim current can be used to negate the effects of the offset current of the operational to around zero.

In certain instances, it is necessary to produce a very small trim current because a respective error source to be corrected is very small. However, a small current is not easy to generate, since it would imply, for example, a strong scaling of a bandgap current (IB=VBG/R). Such a scaling can be done via either a large resistor and/or with a current mirror having a huge aspect ratio, both of which are undesirable.

BRIEF DESCRIPTION

This disclosure includes the observation that conventional techniques of producing trim currents are undesirable. For example, as previously discussed, large integrated resistors used in conventional trim circuits typically occupy a large area and introduce noise in a respective system. Additionally, having current mirrors with a large scaling ratio could compromise respective matching, because the matched structures start to be very different from each other. Yet further, a current mirror conducting current in the nano-ampere range means that the CMOS field effect transistor devices are most likely working in the sub-threshold region. This operating area is not always well-modelled; therefore, there is the risk of designing a circuit whose real behavior is completely different than expected.

Embodiments herein provide improved trimming over conventional techniques. For example, according to one embodiment, a trimming resource includes an adjustable (i.e. controllable current) driver resource, a differential voltage generator, and a trim signal generator. The adjustable driver resource produces an output signal. During operation, the differential voltage generator receives the output signal from the (adjustable) driver resource and produces a differential drive signal. The trim current generator is coupled to the differential voltage generator to receive the differential drive signal. The trim current generator derives a trim signal based on the differential drive signal received from the differential voltage generator.

Note that the trim signal (one or more signals) generated by the trim system as described herein can be used for any suitable purpose. For example, in one embodiment, the trim current generator as described herein outputs one or more trim signals to an electronic component, correcting an operational parameter of the electronic component. In one non-limiting example embodiment, the corrected operational parameter is as an input offset current or other parameter requiring one or more trim signals to provide correction.

In accordance with further embodiments, the output signal received by the differential voltage generator from the adjustable driver resource (such as produced by an analog-to-digital converter) is current. In one embodiment, the differential drive signal produced by the differential voltage generator (as a result of being driven with current from the driver resource) is a voltage signal including a first drive voltage and a second drive voltage. In one nonlimiting example embodiment, the trim signal derived from the differential drive signal is a current signal including at least a first trim current signal and potentially a second trim current signal. In one embodiment, the trim signal produced by the trim circuit as described herein is a differential trim signal.

As previously discussed, the apparatus as described herein can be configured to include an electronic component or electronic circuit such as an amplifier including an inverting input node and a non-inverting input node. If desired, the trim circuitry can be instantiated as respective circuitry on an integrated circuit including the electronic circuitry being trimmed. The trim circuitry (such as trim system) provides error correction.

In accordance with further embodiments, the trim system inputs the first trim current signal of a differential trim signal to the inverting input node of an amplifier; the trim system inputs the second trim current signal of the differential trim signal into the non-inverting input node of the amplifier. As previously discussed, in such an instance, the trim signal is operable to cancel an output offset current associated with the inverting input node and the non-inverting input node of the amplifier (such as operational transconductance amplifier).

In yet further embodiments, as previously discussed, the output signal produced by the adjustable driver resource serves as an input to the differential voltage generator. In one embodiment, the output signal received from the adjustable driver resource is current outputted from the adjustable driver resource; the differential voltage generator optionally includes or is a first resistor through which the current from the output signal passes to produce the differential drive signal. In further embodiments, the trim current generator includes a second resistor and a third resistor; a magnitude of resistance associated with the second resistor is K times greater than a magnitude of a resistance associated with the first resistor; a magnitude of resistance associated with the third resistor is K times greater than a resistance associated with the first resistor.

In one embodiment, K is a ratio value. Based on the ratio value K, a magnitude of the output current from the driver resource is K times greater than the magnitude of the current associated with the differential trim signal.

Note that the ratio value, K, can be any suitable value and fall within any suitable range. However, in one embodiment, the ratio value K is between 5 and 200.

In still further example embodiments, the trim current generator includes a first trim control element (such as a first switch or transistor) and a second trim control element (such as a second switch or transistor).

In accordance with further embodiments, the trim system (apparatus) further includes a network of switches coupling the differential voltage generator to the trim current generator; states of the switches are selectable by a controller to switch operation between a first mode and a second mode. Operation in the first mode includes: connection of a first node of the differential voltage generator to the first trim control element and connection of a second node of the differential voltage generator to the second trim control element; operation in the second mode includes: connecting the first node of the differential voltage generator to the second trim control element and connecting the second node of the differential voltage generator to the first trim control element.

In accordance with yet further example embodiments, in a similar manner as previously discussed, the trim signal is a differential trim signal. In such an instance, the differential trim signal includes at least a first trim signal and a second trim signal. A magnitude of a difference between the first trim signal and the second trim signal varies linearly as a function of a magnitude of the inputted current received by the differential voltage generator from the adjustable driver resource.

Further embodiments herein include a circuit component (such as a resistor, diode, transistor, voltage source, etc.) disposed between the differential voltage generator and a reference voltage (such as ground); in such an instance, the circuit component provides an offset of the differential drive signal with respect to the reference voltage.

In yet further embodiments, the output signal received from the adjustable driver resource is an output current; the received output current passes through the differential voltage generator and the circuit component (such as a resistor, diode, transistor, voltage source, etc.) such that the (differential) drive signal produced by the differential voltage generator is offset with respect to the reference voltage. A first drive signal of the differential drive signal controls a respective first switch (i.e., control element) that produces a first trim signal of the differential trim signal; a second drive signal of the differential drive signal controls a respective switch (i.e., control element) that produces a second trim signal of the differential trim signal.

Note that embodiments herein are useful over conventional techniques. For example, the trim system as described herein provides a novel way of signal tracking (between an output signal of a driver resource and a generated trim signal) in which the generated trim signal (of low magnitude) ratiometrically tracks a respective control signal to provide correction of one or more operational parameters of an electronic component (such as an integrated circuit) being trimmed.

These and other more specific embodiments are disclosed in more detail below.

Note that any of the resources implemented in system as discussed herein can include one or more computerized devices, mobile communication devices, servers, base stations, wireless communication equipment, communication management systems, controllers, workstations, user equipment, handheld or laptop computers, or the like to carry out and/or support any or all of the method operations disclosed herein. In other words, one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to a method, system, computer program product, etc., that supports operations as discussed herein.

One embodiment includes a computer readable storage medium and/or system having instructions stored thereon to produce a trim signal. The instructions, when executed by computer processor hardware, cause the computer processor hardware (such as one or more co-located or disparately located processor devices or hardware) to: produce an output signal; derive a differential drive signal from the output signal; and generate a (differential) trim signal from the differential drive signal.

The ordering of the steps above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

Note further that although embodiments as discussed herein are applicable to trimming, the concepts disclosed herein may be advantageously applied to any other suitable topologies.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section (which is a summary of embodiments) and corresponding figures of the present disclosure as further discussed below.

Figure 1:
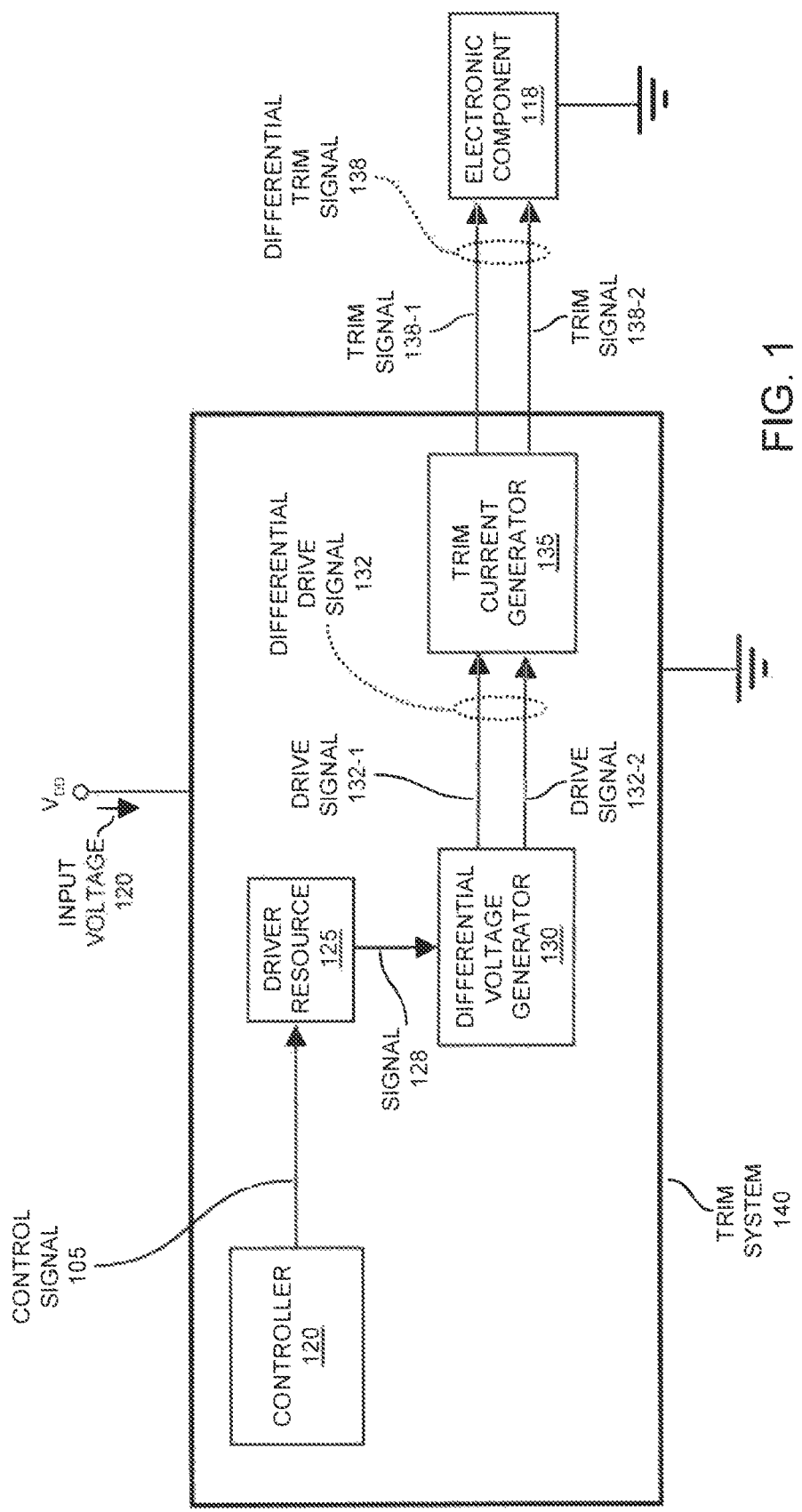
FIG. 1 is an example diagram illustrating a trim system according to embodiments herein.

The foregoing and other objects, features, and advantages of embodiments herein will be apparent from the following more particular description herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

As previously discussed, according to one embodiment, a trim system includes an adjustable driver resource, a differential voltage generator, and a trim current generator. The adjustable driver resource produces an output signal. The differential voltage generator receives the output signal from the adjustable driver resource and produces a differential drive signal. The trim current generator derives a trim signal from the differential drive signal received from the differential voltage generator. According to one configuration, the trim current generator outputs the trim signal to an electronic component, correcting one or more operational parameters of the electronic component.

Now, with reference to the drawings, FIG. 1 is an example diagram illustrating a trim system according to embodiments herein.

As shown, the example trim system 140 (such as a trim circuit) in FIG. 1 includes driver resource 125 (such as controllable drive resource), differential voltage generator 130, and trim current generator 135.

In this example embodiment, the driver resource 125 is operable to receive control signal 105 from the controller 120. Driver resource 125 produces output signal 128 based on the control signal 105.

Differential voltage generator 130 is coupled to receive signal 128 from the driver resource 125. Signal 128 is an output signal with respect to the driver resource 125 and an input signal with respect to the differential voltage generator 130

Further, trim current generator 135 is coupled to receive differential drive signal 132 (such as drive signal 132-1 and drive signal 132-2) from the differential voltage generator 130. Based on the differential drive signal 132, trim current generator 135 produces differential trim signal 138 (trim signal 138-1 and trim signal 138-2) to provide trimming to the electronic component 118.

In general, as previously discussed, embodiments herein provide improved trimming over conventional techniques. For example, during operation, the (adjustable) driver resource 125 produces signal 128 (such as an output signal from adjustable driver resource and input signal to the differential voltage generator 130) based on control signal 105 provided by controller 120.

In one embodiment, control signal 105 controls an amount of current (associated with signal 128) outputted from the driver resource 125 to the differential voltage generator 130.

Yet further, in one embodiment as previously discussed, the differential voltage generator 130 produces a differential drive signal 132 (such as drive signal 132-1 and drive signal 132-2) based on the received signal 128 (such as current) from the driver resource 125. The trim current generator 135 derives one or more trim signals (such as differential trim signal 138 including trim signal 138-1 and trim signal 138-2) from the differential drive signal 132 received from the differential voltage generator 130.

In one embodiment, the trim current generator 135 outputs the one or more trim signals 138 to an electronic component 118 being trimmed. Trimming provides increased accuracy of the electronic component 118.

In accordance with further embodiments, a magnitude of the differential trim signal 138 ratiometrically tracks the amount of current inputted to the differential voltage generator 130 via the signal 128. For example, in one nonlimiting example embodiment, a difference in current (measured in amperes) between the trim signal 138-1 and 138-2 tracks a magnitude of the current provided by signal 128 to the differential voltage generator 130. The trim signal(s) outputted from the trim system 140 corrects an operational parameter of the electronic component 118 such as an input offset current or other operational parameter of the electronic component 118 requiring one or more trim signals to provide correction.

Note that the trim system as described herein can be instantiated in any suitable manner. For example, the trim system 140 can be implemented on an integrated circuit on which the electronic component resides, as one or more integrated circuits (a.k.a., a semiconductor chip), discrete circuit components, etc.

Figure 2:
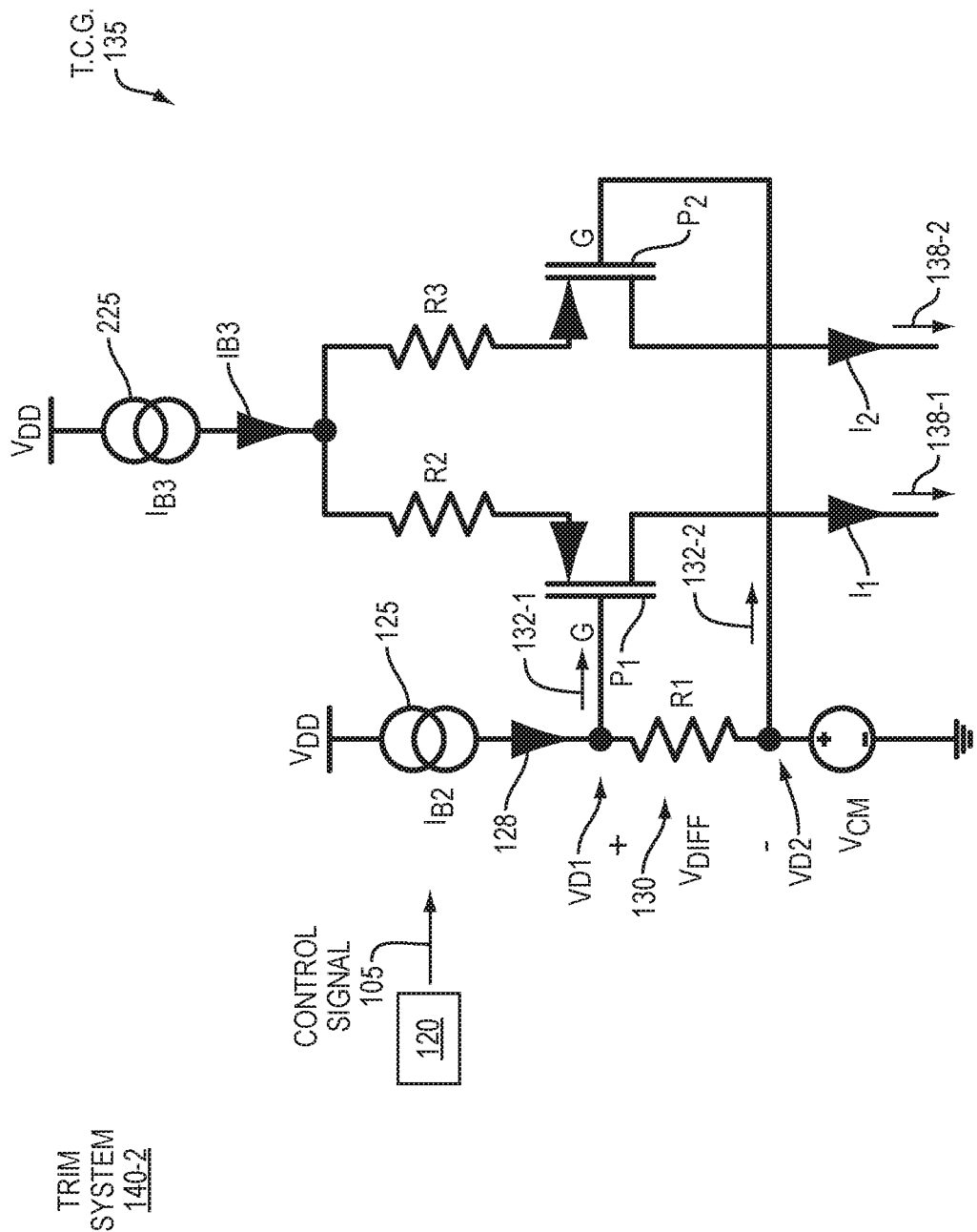
FIG. 2 is an example diagram illustrating details of a trim signal generator according to embodiments herein.

FIG. 2 is an example diagram illustrating details of a trimmer system according to embodiments herein.

In this example embodiment, driver resource 125 is a current source supplying signal 128 (such as current IB2) to the differential voltage generator 130. The controller 120 produces and outputs control signal 105 to control a magnitude of the current associated with signal 128 (IB2) delivered to the differential voltage generator 130.

As further shown, the differential voltage generator 130 is configured as or configured to include a resistor R1 (having resistance R) and common mode source VCM (i.e., circuit component).

In this example embodiment, resistor R1 is coupled between the driver resource 125 and the common mode voltage source VCM. Accordingly, embodiments herein include a circuit component (common mode voltage source) disposed between the differential voltage generator 130 and a reference voltage (ground reference).

As described herein, the circuit component (i.e. common mode source Vcm) provides an offset of the differential drive signal (VDIFF) with respect to a corresponding reference voltage such as ground reference voltage.

Trim current generator 135 includes current source 225, resistor R2, resistor R3, transistor P1 (a.k.a., a first trim current control element) and transistor P2 (a.k.a., a second trim current control element).

During operation, current source 225 receives power from input voltage source VDD. Current source 225 drives corresponding current IB3 (signal) through the parallel circuit paths including transistor P1 and transistor P2.

More specifically, a first transistor path of trim current generator 135 includes a series combination of resistor R2 and transistor P2 (switch); a second transistor path of trim current generator 135 includes a series combination of resistor R3 and transistor P1 (switch).

As further shown, transistor P1 controls generation of trim signal 138-1; transistor P2 controls generation of trim current 138-2.

In one embodiment, the resistance of R2 is K times the resistance of resistor R1; the resistance of resistor R3 is K times the resistance of resistor R1.

Further in this example embodiment, the input to the differential voltage generator 130 (a.k.a., a cell) is current IB2, which creates a differential voltage VDIFF across resistor R1 as previously discussed. This differential voltage VDIFF (magnitude of VD2−VD1 or VD1−VD2) appears in series with the common mode source (VCM) of the differential voltage generator 130.

In one embodiment, the common mode source Vcm is the common voltage of the differential element pair constituted by transistors P1 and P2, which collectively control generation of differential trim current 138.

In this example embodiment, the voltage VD2 drives the gate node of transistor P2; the voltage VD1 drives the gate node of transistor P1.

Based on the magnitude of the voltage VD1 applied to its gate, transistor P1 (a.k.a., current flow control element such as a switch, field effect transistor, bipolar junction transistor, etc.) controls a magnitude of current provided by trim signal 138-1; based on the magnitude of the voltage VD2 applied to its gate, transistor P2 (a.k.a., current flow control element such as a switch, field effect transistor, bipolar junction transistor, etc.) controls generation of trim signal 138-2.

During conditions in which IB2 is zero, then VDIFF is also zero and the differential pair is at equilibrium. In such an instance, each of the respective circuit paths (such as a first circuit path including transistor P1 and resistor R2 (which equals k times the resistance of R1), and a second circuit path including transistor P2 and resistor R3 (which equals K times the resistance of R1) conduct a current at a magnitude equal to IB3/2, and therefore the differential trim current I1−I2 is null (i.e., zero).

If, on the other hand, the current IB2 is different than a zero setting, then differential voltage VDIFF is non-zero and creates an unbalance in the differential pair current I1 (138-1) and I2 (138-2). A magnitude of the difference between I1 and I2 varies depending upon the magnitude of the current IB2 provided by drive resource 125 to the differential voltage generator 130.

Assuming that the magnitude of the perturbation is small with respect to the magnitude of the quiescent point, this unbalance will create a differential current I_DIFF equal to:

$$IDIFF = I1 - I2 = gm/(1+gm*K*R1)VDIFF \quad (eq. 1)$$

where gm represents the transconductance of transistors P1 and P2.

Assuming now that $gm*K*R1 \gg 1$ and knowing that VDIFF=R1*IB2, then eq. (1) becomes:

$$IDIFF \approx IB2/K \quad (eq. 2)$$

The above expression essentially shows that the output current of the degenerated transconductor is a function of the input current IB2 and of the resistor-ratio K (for example ratio of resistances R2/R1=K, ratio of resistances R3/R1=K). Therefore, a current scaling of ratio K is potentially attainable via trim system 140.

The control current IB2 is fairly large with respect to the trim current (trim signal 138-1 and trim signal 138-2), which is much smaller depending on the magnitude of the ratio, K.

Figure 3:
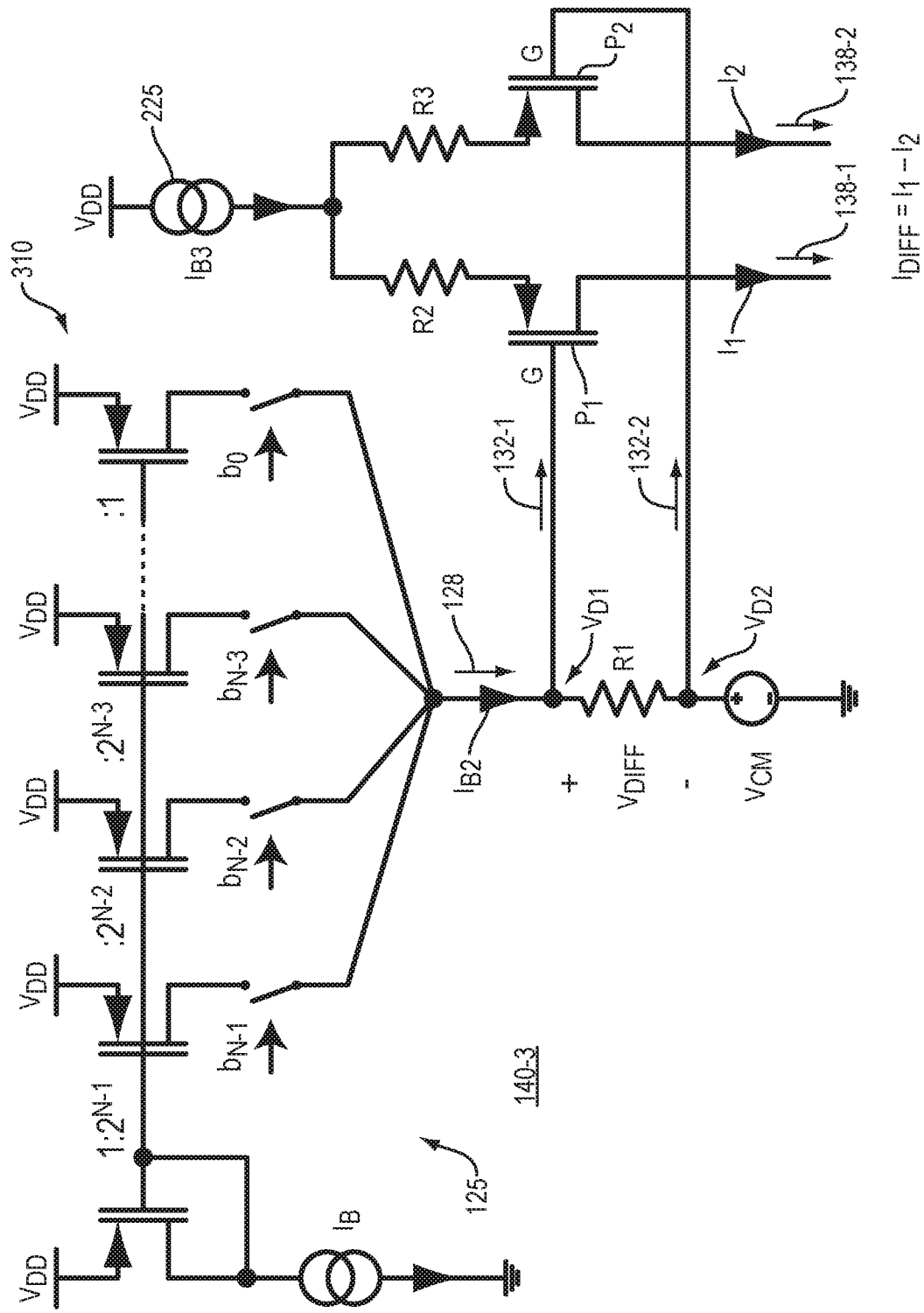
FIG. 3 is an example diagram illustrating implementation of an analog-to-digital converter in a trim signal generator according to embodiments herein.

FIG. 3 is an example diagram illustrating implementation of an analog-to-digital converter in a trimmer circuit according to embodiments herein.

In this example embodiment, the driver resource 125 is or includes a digital-to-analog converter 310. In such an instance, the LSB of the driver resource 125 is now IB/K, where K can be set to any suitable value in a range between 10 and 100, or K is a value in a range between 3 and 500, or any suitable value outside these example ranges. In one embodiment, the ratio between IB and IB2 is greater or less than 1 such as between 1/32 and 32.

In such an instance, this means that IB2 (if it were otherwise used as the final trim current itself) does not need to be in the nano-amperes range, which eliminates the necessity of huge resistors and large current mirror ratios to generate it. Instead, the current IB2 (signal 128) is used as a base drive current through the differential voltage generator 130 to ratiometrically control a magnitude of the differential trim signal 138. In other words, in one embodiment, the trim current 138 (IDIFF I1−I2) is IB2*(1/K). Thus, embodiments herein provide a way to generate a very small current from a base current signal 128.

Another benefit of the proposed solution is the fact that the transistors making up the current mirrors do not need to work in the sub-threshold region, which makes the circuit less dependent on the models of the devices. The same observation is valid for transistors P1 and P2, which can easily operate in the saturation region even though their differential current is in the nano-amperes range.

Finally, via embodiments herein, the circuit designer has an additional degree of freedom with respect to choosing a value for K. In particular, the LSB also depends on the resistor ratio K, which can be adjusted separately from other circuit parameters.

Figure 4:
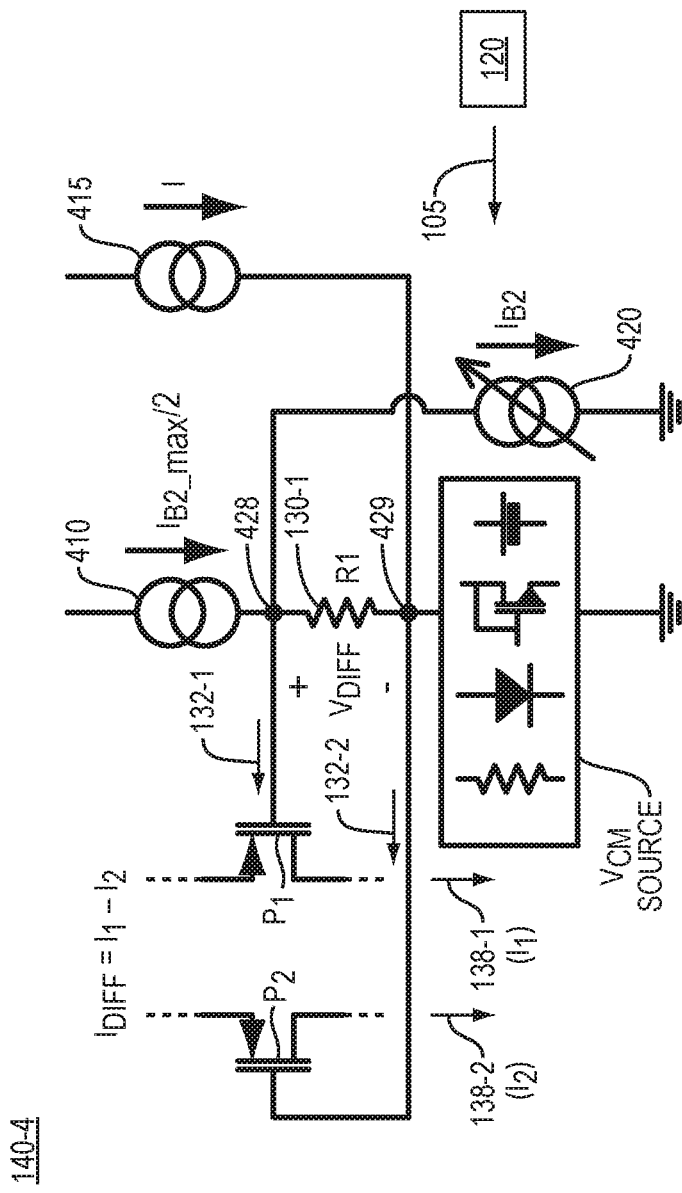
FIG. 4 is an example diagram illustrating details of a trim signal generator according to embodiments herein.

FIG. 4 is an example diagram illustrating details of a trimmer circuit according to embodiments herein.

In this example embodiment of trim system 140-4, the current source 410 supplies respective current IB2_max/2 to node 428 of the differential voltage generator 130-1 (such as resistor R1); corresponding current source 420 sinks current IB2 from node 428. Current source 415 drives current I to node 429 of the differential voltage generator 130-1.

Controller 120 controls a magnitude of current IB2.

As previously discussed, a magnitude of the differential trim current (IDIFF=I1−I2) varies depending on the differential voltage VDIFF across resistor R1, which itself varies depending on the applied drive current IB2.

Figure 5:
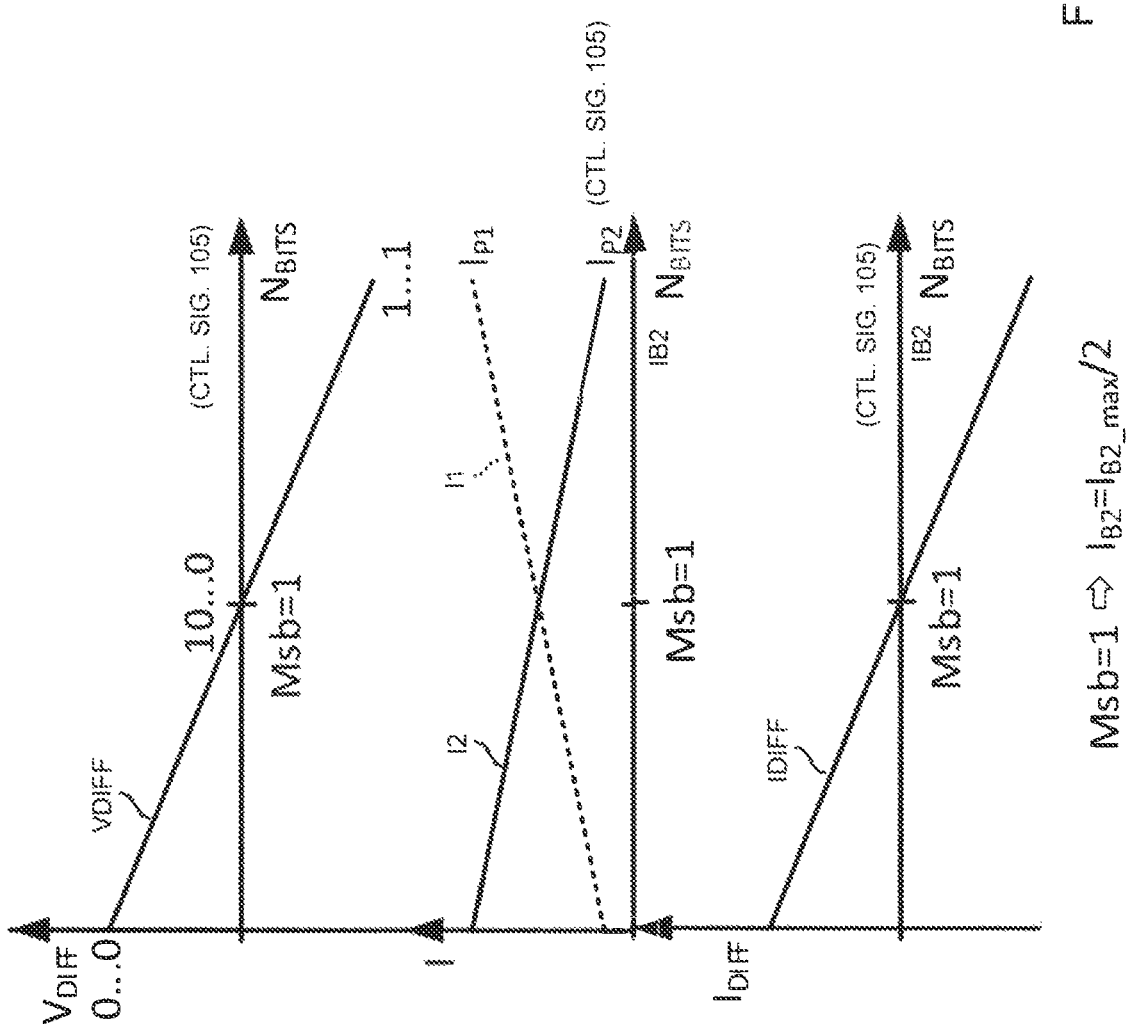
FIG. 5 is an example diagram illustrating adjustment of a trim signal over a range of trim value settings according to embodiments herein.

Embodiments herein include sweeping a range of different drive currents inputted through the resistor R1 to vary the magnitude of the trim current as shown in FIG. 5.

FIG. 5 is an example diagram illustrating adjustment of a trim signal over a range of trim value settings according to embodiments herein.

As previously discussed, a respective digital-to-analog converter associated with the adjustable driver resource 125 can include any number of bits. As shown in timing diagram 500, for an example 8 bit digital-to-analog converter, the input of a respective digital-to-analog converter varies in a range between 00000000 and 11111111 to produce different trim current values.

More specifically, controller 120 produces control signal 105 to set the analog-to-digital converter. IB2 from current source 420 equals IB2_max when control signal 105=11111111; thus, IB2_max represents the maximum current of IB2 outputted by current source 420 (such as a digital-to-analog converter) when control signal 105 is 11111111.

IB2=IB2_max/2 when control signal 105 is set to 10000000; thus, IB2_max/2 represents the middle point current of IB2 outputted by current source 420 (such as a digital-to-analog converter) when control signal 105 is 10000000.

Current source 410 applies current I to node 429 of the resistor R1.

With further reference to the trim system 140-4 in FIG. 4, when I>IB2, for 0≤IB2<IB2_max/2 (such as IB2 varying based on input settings between 00000000 and 10000000), VDIFF>0 and there is the maximum positive correction for IB2=0.

For a condition in which IB2=IB2_max/2, VDIFF=0, IDIFF=0, there isn't any trim correction because I1=I2.

For a condition in which IB2_max/2<IB2≤IB2_max (such as IB2 varying based on input between 10000000 and 11111111), VDIFF<0 and there is the maximum negative correction for IB2=IB2_max.

Note that a respective designer could decide how many steps and the preferred step size template information to implement trimming.

Additionally, note that if a voltage supply is used as reference voltage in the circuit, the current source 415 producing IB is not necessary anymore.

The advantage of this solution in FIGS. 4 and 5 is that only one trim ramp (varying between input digital-to-analog converter range 00000000 and 11111111) is necessary to find the correct trim setting for electronic component 118.

Figure 6:
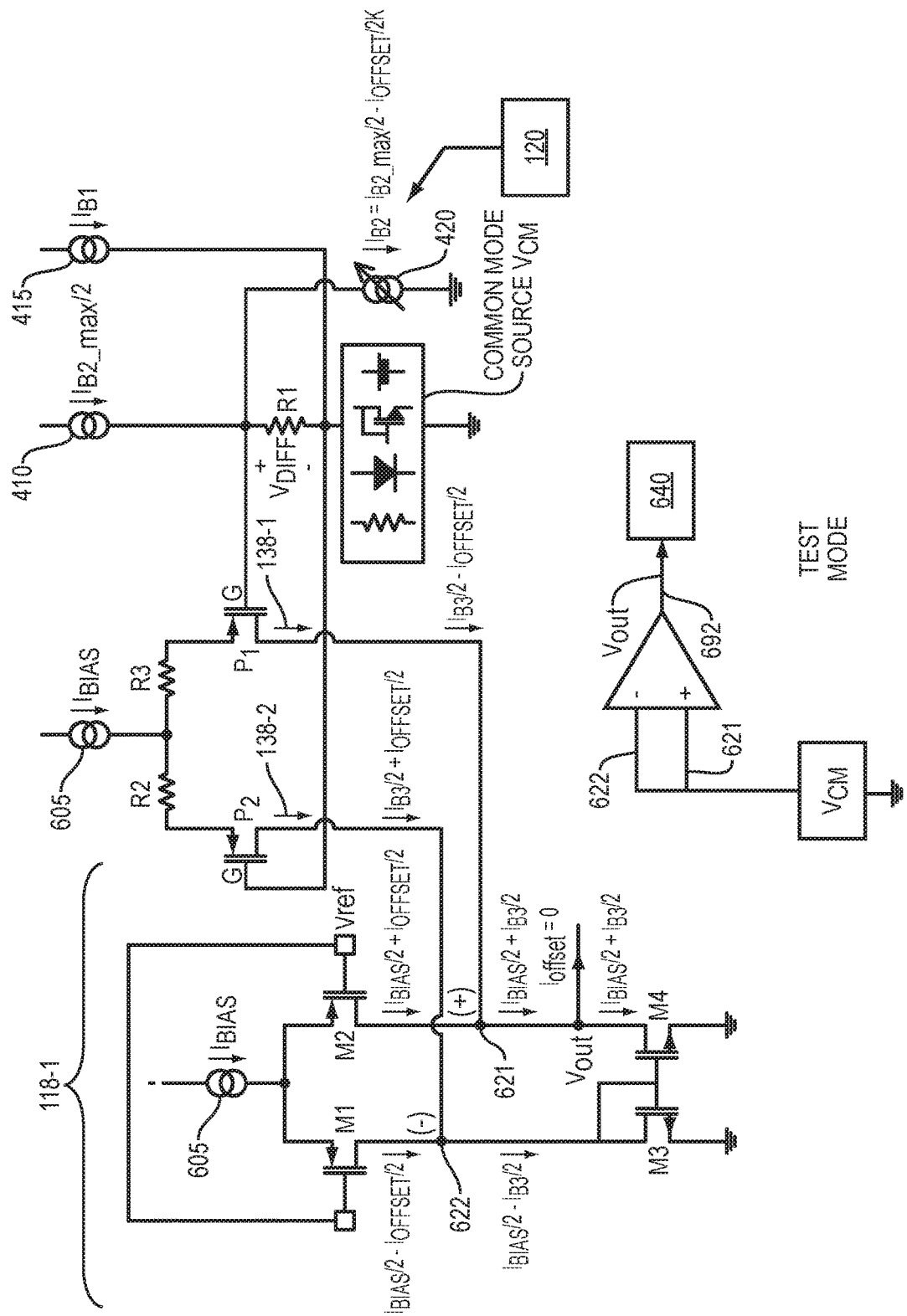
FIG. 6 is an example diagram illustrating application of a trim signal to an electronic component according to embodiments herein.

FIG. 6 is an example diagram illustrating application of a trim signal to an electronic component according to embodiments herein.

In this example embodiment, the trim system 140-6 provides trim adjustment to electronic component 118-1.

Electronic component 118-1 includes current source 605 and devices M1, M2, M3, and M4. Note that each of the devices M1, M2, M3, and M4 can be any suitable type of resources such as a field effect transistor, bipolar junction transistor, etc.

In one embodiment, electronic component 118-1 is an amplifier such as an operational amplifier circuit. In one embodiment. the electronic component 118-1 is a transconductance amplifier having a differential output. Node 622 represents an inverting input (−) of the active load of the operational amplifier circuit. Node 621 represents the non-inverting input (+) of the active load of the operational amplifier circuit.

As further shown, device M1 is connected in series with device M3; device M2 is connected in series with device M4.

Ideally, the current source 605 produces the current IBIAS that is split between flowing through switch M1 and switch M2 of the electronic component 118-1. However, in this example embodiment, the electronic component 118-1 has an error of IOFFSET associated with the non-inverting input node 621.

As previously discussed, embodiments herein include substantially reducing or eliminating this source of error via a respective differential trim signal 138.

In such an instance, as shown in FIG. 6, the switch M1 inputs current IBIAS/2−IOFFSET/2 into the node 622; the switch M2 inputs current IBIAS/2+IOFFSET/2 into the node 621. As previously discussed, IOFFSET represents an error in the electronic component 118-1 that will be corrected via the trim signal 138.

As further discussed below, embodiments herein include controlling the trim system 140-6 to produce a respective differential trim signal 138 such that the IOFFSET of the electronic component 118-1 is substantially reduced to zero.

For example, as shown, the trim signal 138-1 is inputted to the node 621. The trim signal 138-2 is inputted to the node 622. As further discussed below, input of the trim signal to the electronic component 118-1 eliminates the offset current error IOFFSET to zero or substantially reduces it to be around zero.

Accordingly, embodiments herein include generation of a trim signal 138 to cancel an offset current (IOFFSET) associated with the inverting input node 621 and the non-inverting input node 622 of the respective electronic component 118-1.

As further discussed below, embodiments herein include operating the electronic component 118-1 in a test mode in which both nodes 621 and 622 are driven with a same voltage value (such as from common mode source Vcm). The monitor resource 640 monitors an output 692 of the electronic component 118-1 while the controller 120 varies a magnitude of the current driving the resistor R1 to determine a proper amount of trim current 138 needed to reduce IOFFSET to zero or substantially zero.

Figure 7:
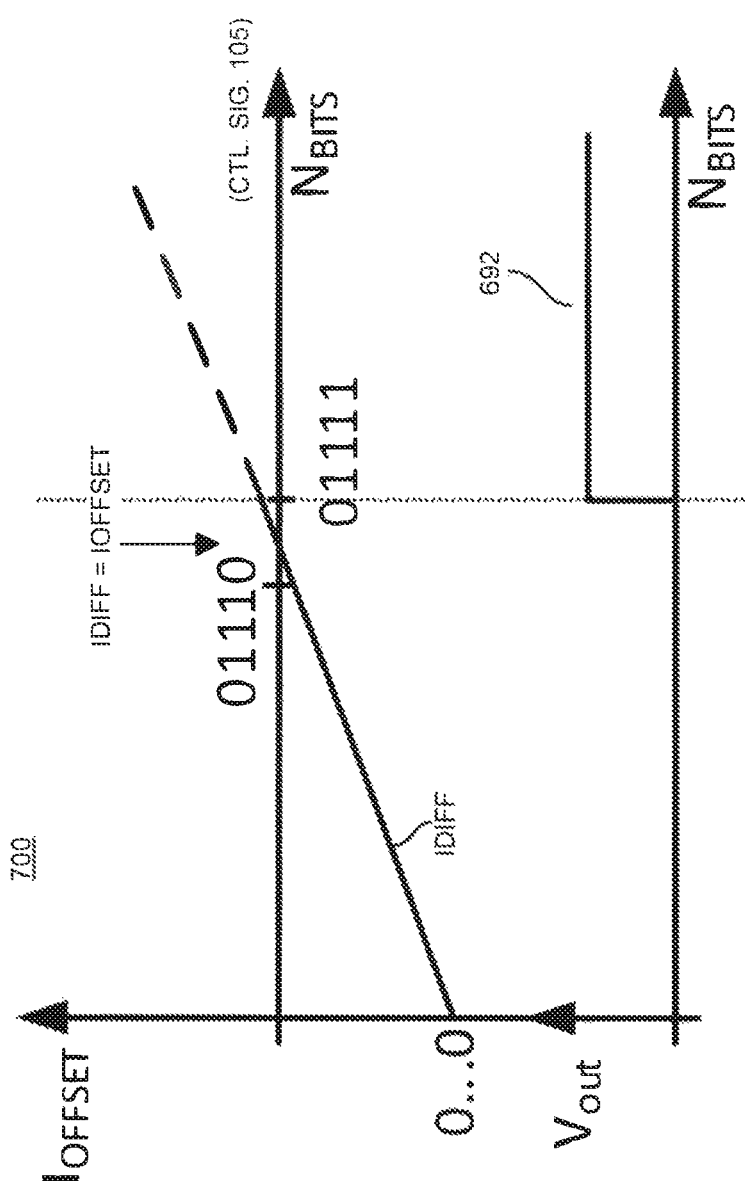
FIG. 7 is an example diagram illustrating adjustment of a trim signal over a range of settings to select a trim setpoint according to embodiments herein.

FIG. 7 is an example diagram illustrating adjustment of a trim signal over a range of settings to select a trim setpoint according to embodiments herein.

As previously discussed, one way to identify a respective setpoint for the trim system 140-6 (to substantially eliminate the IOFFSET current) is to set the node 622 and node 623 od the electronic component 118-1 (circuit being trimmed) to a same common mode voltage (such as ground or any other suitable value) as shown in FIG. 6.

Monitor resource 640 monitors the output voltage (at output 692) of the electronic component 118-1 while the trim system 140-6 applies different trim settings (trims signals) to the respective nodes 621 and 622 as shown.

As shown in FIG. 7, while stepping through the range (such as starting at setting 00000 and monotonically stepping through the different settings 00001, 00010, 00011, etc., to increase a magnitude of the trim current) of possible trim currents via control of current source 420 as shown in graph 700 of FIG. 7, the monitor resource 640 keeps track of a corresponding trim control setting applied by controller 120 to the current resource 420 when detecting that the output voltage (at output 692) of the electronic component 118-1 switches from one state to another, such as from a logic low to a logic high state.

In this example embodiment, the value (such as 01110 or 01111) represents the setting of the trim system 140-6 that is needed to substantially reduce the IOFFSET error current associated with the electronic component 118-1 to zero (or around zero). In other words, setting the current through resistor R1 based on setting 01110 produces an appropriate trim signal to eliminate IOFFSET.

Further embodiments herein include storing the identified value (01110 or 01111) and operating the trim system 140-6 at this setting during a non-test mode in which the electronic component 118-1 is used in a respective circuit application.

Thus, embodiments herein identifying an appropriate trim setting to correct the parameter associated with the electronic component 118-1 and then implement the identified trim setting in a non-test mode implementation of the electronic component 118-1 to provide increased accuracy of the electronic component 118-1.

Figure 8:
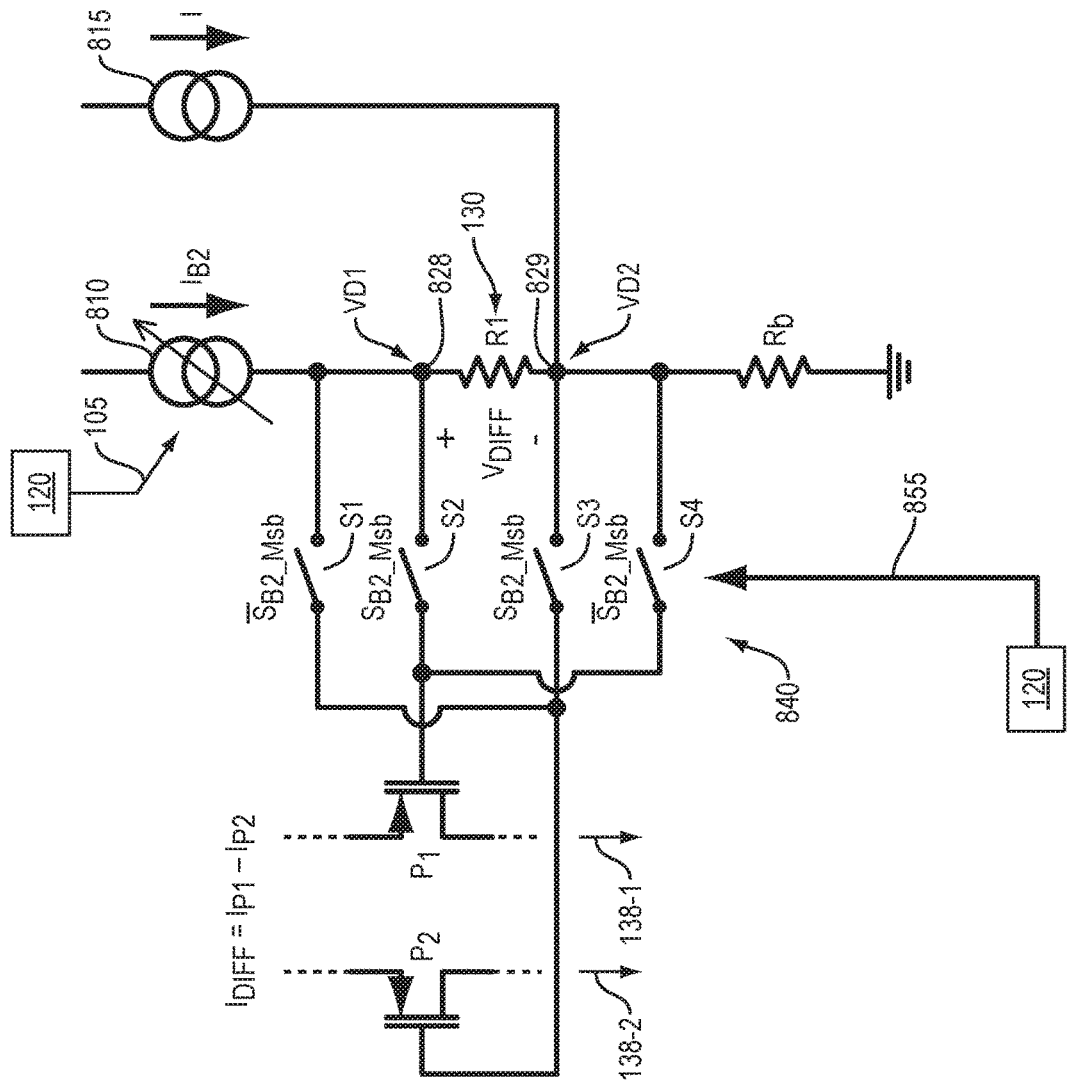
FIG. 8 is an example diagram illustrating a trimmer system including a network of switches according to embodiments herein.

FIG. 8 is an example diagram illustrating a trimmer system including a network of switches according to embodiments herein.

This example embodiment includes network of switches 840 (such as switches S1, S2, S3, and S4) enabling conveyance of the voltage VD1 (of differential voltage VDIFF) at node 828 of differential voltage generator 130 (such as resistor R1) to either gate of transistor P1 or gate of transistor P2 depending on settings of the network of switches 840.

The network of switches 840 also enables conveyance of the voltage VD2 (of differential voltage VDIFF) at node 829 of differential voltage generator 130 (such as resistor R1) to either gate of transistor P2 or gate of transistor P1 depending on settings of the network of switches 840.

For example, controller 120 generates control signals 855 to control states of respective switches S1, S2, S3, and S4 in network of switches 840.

In a first operational mode, as further discussed below, activation of both switch S2 and switch S3 at the same time (while switch S1 and switch S4 are open) causes the voltage VD1 of the differential voltage VDIFF at node 828 to drive the gate node of transistor P1 and the voltage VD2 of the differential voltage VDIFF at node 829 to drive the gate node of transistor P2.

Conversely, in a second operational mode, as further discussed below, activation of both switch S1 and switch S4 closed at the same time (while switch S2 and switch S3 are open) causes the voltage VD1 at node 828 to drive the gate node of transistor P2 and the voltage VD2 at node 829 to drive the gate node of transistor P1.

The advantage of the solution as described herein (including network of switches 840) is that the current consumption is lower and the circuit area to instantiate a respective trim system is smaller.

In a similar manner as previously discussed, the controller 120 can be configured to step through different settings to determine an appropriate trim current needed to reduce or eliminate the offset current error IOFFSET to zero or around zero.

Figure 9:
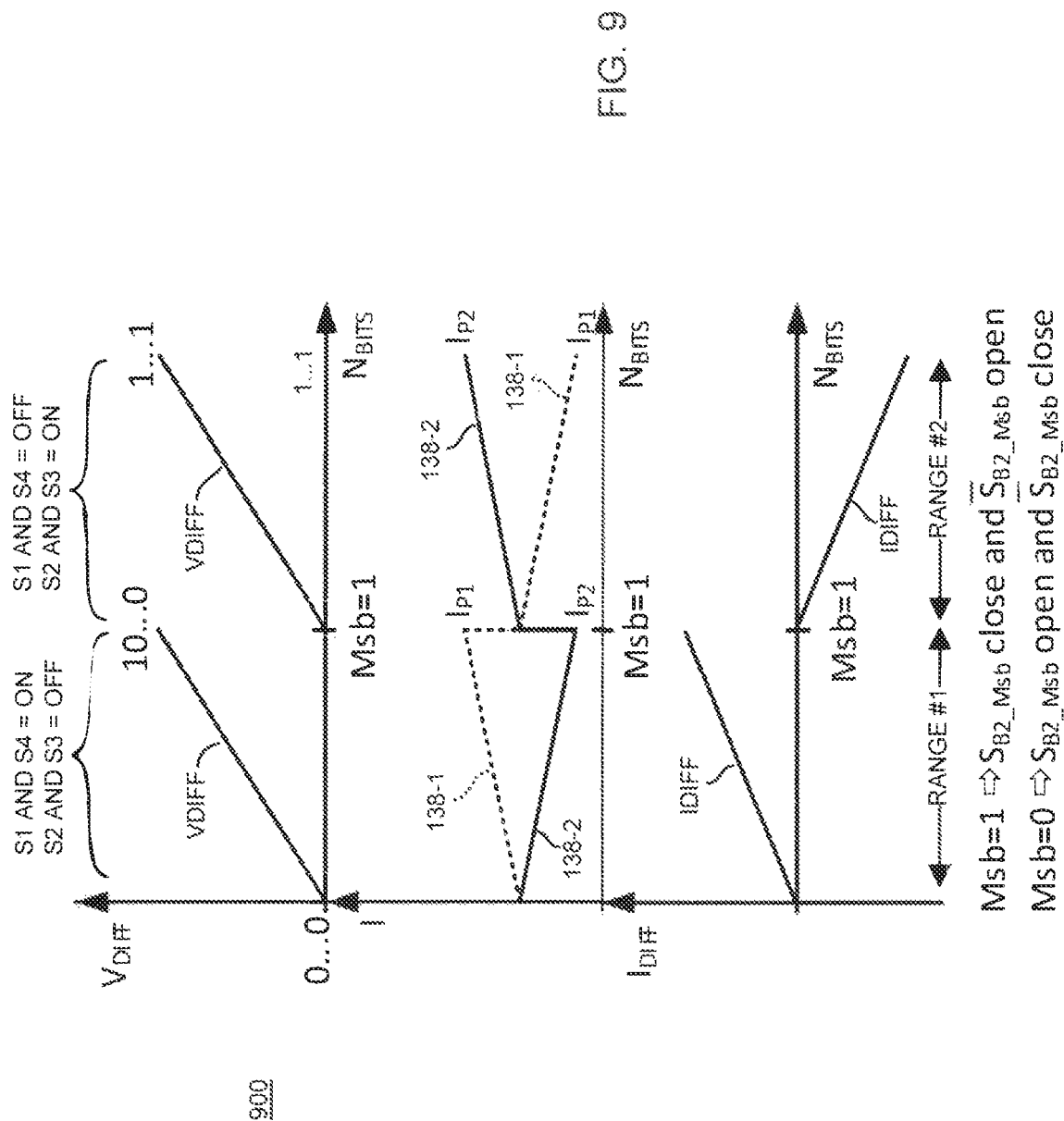
FIG. 9 is an example diagram illustrating adjustment of a trim signal over a range of trim value settings according to embodiments herein.

FIG. 9 is an example diagram illustrating adjustment of a trim signal over a range of trim value settings according to embodiments herein.

Graph 900 illustrates different settings of controlling current source 810 in FIG. 8 between range #1 (switches S1 and S4 closed, switches S2 and S3 open) of corresponding settings 00000000 and 10000000 (midpoint) of current source 810 (digital-to-analog converter) producing IB2 as well as between range #2 of corresponding settings 10000000 and 11111111 (endpoint) of corresponding current source 810 producing IB2.

In a manner as previously discussed, embodiments herein include controller 120 being set to different values within range #1 and/or range #2 to set the corresponding differential trim signal 138 (trim signal 138-1 and trim signal 138-2) to the appropriate setting.

Thus, with respect to trim system 140-8 in FIG. 8: as shown in FIG. 9, for $0 \leq IB2 < IB2\_MAX/2$ (where IB2_MAX2 is unrelated to IB2_max in prior example) and switch SB2_Msb closed (i.e., switches S2 and S3 closed circuit, low resistance path) and switches SB2_Msb opened (i.e., switches S1 and S4 open circuit, high resistance), VDIFF≥0.

For $0 \leq IB2 \leq IB2\_MAX2$ and SB2_Msb opened (i.e., switches S2 and S3 open circuit, high resistance), and SB2_Msb closed (i.e., switches S1 and S4 closed circuit, low resistance path), VDIFF≥0.

Figure 10:
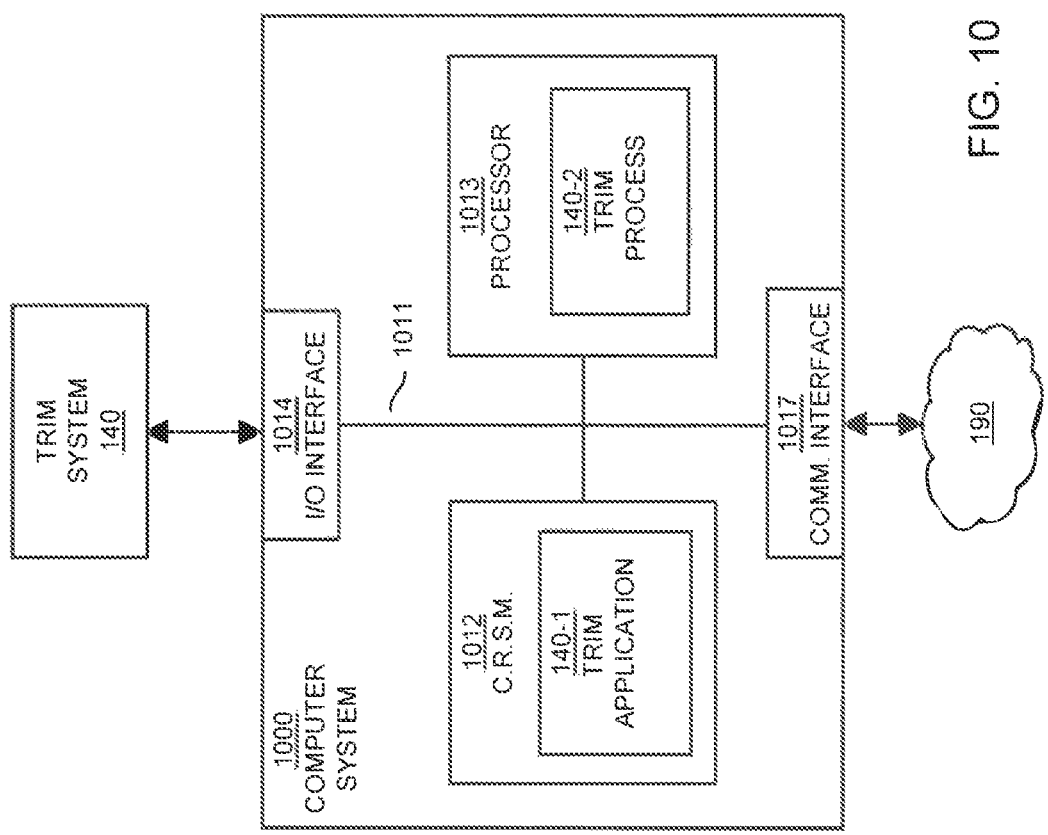
FIG. 10 is an example diagram illustrating example computer architecture operable to execute one or more methods according to embodiments herein.

FIG. 10 is an example diagram illustrating example computer architecture operable to execute one or more methods according to embodiments herein.

As previously discussed, any of the resources (such as controller 120, any part of trim system 140, monitor resource 640, etc.) as discussed herein can be configured to include computer processor hardware and/or corresponding executable instructions to carry out the different operations as discussed herein.

As shown, computer system 1000 of the present example includes an interconnect 1011 that couples computer readable storage media 1012 such as a non-transitory type of media (which can be any suitable type of hardware storage medium in which digital information can be stored and retrieved), a processor 1013 (computer processor hardware), I/O interface 1014, and a communications interface 1017.

I/O interface(s) 1014 supports connectivity to trim system 140.

Computer readable storage medium 1012 can be any hardware storage device such as memory, optical storage, hard drive, floppy disk, etc. In one embodiment, the computer readable storage medium 1012 stores instructions and/or data.

As shown, computer readable storage media 1012 can be encoded with trim application 140-1 (e.g., including instructions) to carry out any of the operations as discussed herein.

During operation of one embodiment, processor 1013 accesses computer readable storage media 1012 via the use of interconnect 1011 in order to launch, run, execute, interpret or otherwise perform the instructions in trim application 140-1 stored on computer readable storage medium 1012. Execution of the trim application 140-1 produces trim process 140-2 to carry out any of the operations and/or processes as discussed herein.

Those skilled in the art will understand that the computer system 1000 can include other processes and/or software and hardware components, such as an operating system that controls allocation and use of hardware resources to execute trim application 140-1.

In accordance with different embodiments, note that computer system may reside in any of various types of devices, including, but not limited to, a power supply, switched-capacitor converter, power converter, a mobile computer, a personal computer system, a wireless device, a wireless access point, a base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 1050 may reside at any location or can be included in any suitable resource in any network environment to implement functionality as discussed herein.

Figure 11:
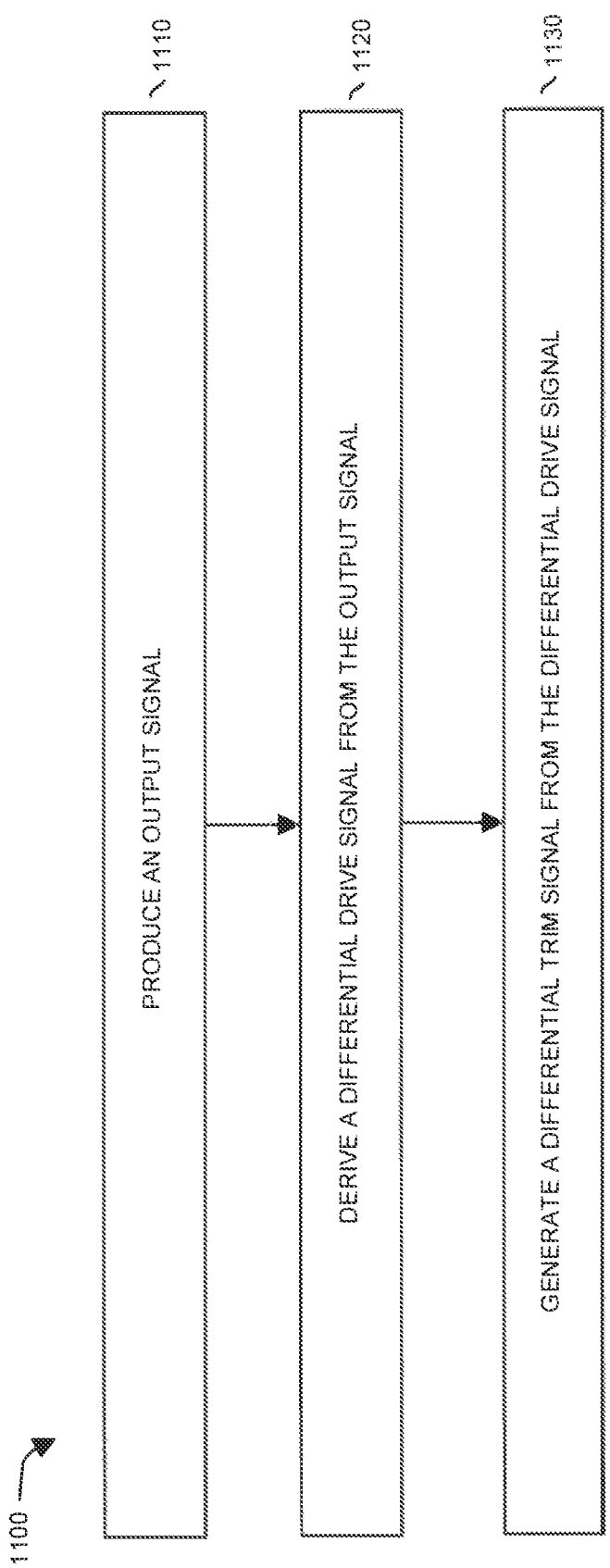
FIG. 11 is an example diagram illustrating a method according to embodiments herein.

Functionality supported by one or more resources as described herein are discussed via flowchart in FIG. 11. Note that the steps in the flowcharts below can be executed in any suitable order.

FIG. 11 is a flowchart 1100 illustrating an example method according to embodiments herein. Note that there will be some overlap with respect to concepts as discussed above. In processing operation 1110, the driver resource 125 produces (output) signal 128.

In processing operation 1120, the differential voltage generator 130 derives a differential drive signal 132 from the (output) signal 128.

In processing operation 1130, the trim current generator 135 generates a differential trim signal 138 from the differential drive signal 132.

As previously discussed, in one embodiment, the trim system 140 outputs the differential trim signal 138 to an electronic component 118 such as an amplifier to correct an operational parameter such as the input offset current.

Accordingly, embodiments herein include a trimming method, apparatus, system, etc., for producing ultra-low offset currents (trim currents). One embodiment of a proposed trimming circuit as described herein is based on a "degenerated transconductor" cell.

More specifically, as previously discussed, the input of the "degenerated transconductor" is current IB2, which comes from a digitally controlled current mirror. Current IB2 creates a differential voltage VDIFF across resistor R1. This differential voltage creates an unbalance in the differential pair formed by transistors P1 and P2. Assuming that the magnitude of the perturbation is small with respect to the magnitude of the quiescent point, this unbalance will create a differential current ITRIM (a.k.a., IDIFF) that is directly proportional to IB2 and inversely proportional to K, the ratio of the source resistors R2 and R3 to resistor R1. The assumption is also that gmkR1>>1, with gm the transconductance of the differential pair devices.

Depending on the value of IB, on the current mirror ratio, and on the parameter K, the LSB value of ITRIM can easily reach the nano-amperes range. This goal is achieved without using huge resistors or large current mirror ratios. Moreover, all the devices can perfectly work in the saturation region, therefore avoiding the weak-inversion region and all the problems associated to it.

The novel solution offers an additional degree of freedom for generating IDIFF=ITRIM=I1−I2 not attainable in the prior art. Specifically, the resistor ratio K, which can be adjusted separately from the other circuit's parameters.

One application of the trimming method as described herein is to cancel (or reduce) the offset current of the circuit of interest (such as amplifiers) in order to obtain accuracies such as on the order of single digit nano-amperes, tens of nano-amperes, hundreds of nano-amperes, etc.

Note again that techniques herein are well suited for use in trim applications. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
an adjustable driver resource operable to output first current;
a differential voltage generator operable to produce a differential drive signal based on the first current received from the adjustable driver resource;
a trim current generator operable to generate a second current; and
the trim current generator further operable to derive a differential trim signal from the second current based on the differential drive signal received from the differential voltage generator.

2. The apparatus as in claim 1,
wherein the differential drive signal is a voltage signal including a first drive voltage and a second drive voltage; and
wherein the trim signal is a differential current signal including a first trim current signal and a second trim current signal.

3. The apparatus as in claim 2 further comprising:
an amplifier including an inverting input node and a non-inverting input node, the first trim current signal inputted to the inverting input node, the second trim current signal inputted to the non-inverting input node; and
wherein the trim signal is operable to reduce an offset current associated with the inverting input node and the non-inverting input node.

4. The apparatus as in claim 1, wherein the adjustable driver resource is a digital-to-analog converter.

5. The apparatus as in claim 1,
wherein the differential voltage generator is a first resistor through which the current passes to produce the differential drive signal.

6. The apparatus as in claim 5, wherein the trim current generator includes a second resistor and a third resistor;
wherein a resistance of the second resistor is K times greater than a resistance of the first resistor;
wherein a magnitude of a resistance of the third resistor is K times greater than a resistance of the first resistor; and
wherein K represents a ratio value.

7. The apparatus as in claim 1, wherein the trim current generator includes a first trim control element and a second trim control element, the apparatus further comprising:
a network of switches coupling the differential voltage generator to the trim current generator, states of the switches in the network selectable to switch operation between a first mode and a second mode;
operation in the first mode including: connection of a first node of the differential voltage generator to the first trim control element and connection of a second node of the differential voltage generator to the second trim control element; and
operation in the second mode including: connection of the first node of the differential voltage generator to the second trim control element and connection of the second node of the differential voltage generator to the first trim control element.

8. The apparatus as in claim 1, wherein the differential trim signal includes a first trim signal and a second trim signal; and wherein a magnitude of a difference between the first trim signal and the second trim signal varies linearly as a function of a magnitude of the first current received from the adjustable driver resource.

9. The apparatus as in claim 1 further comprising:
a circuit component disposed between the differential voltage generator and a reference voltage, the circuit component providing an offset of the differential drive signal with respect to the reference voltage.

10. The apparatus as in claim 9, wherein the first current received from the adjustable driver resource passes through the differential voltage generator and the circuit component.

11. The apparatus as in claim 1, wherein a magnitude of the differential drive signal varies depending on the magnitude of the first current received from the adjustable driver resource.

12. The apparatus as in claim 11, wherein the differential voltage generator includes a circuit component through which the first current passes to produce the differential drive signal.

13. The apparatus as in claim 12, wherein the differential drive signal is offset with respect to ground via a common mode voltage source.

14. The apparatus as in claim 12, wherein the differential drive signal is a differential voltage signal including a first drive voltage and a second drive voltage;
wherein the circuit component includes a first node and a second node, the first node receiving the first current from the adjustable driver resource as input, the first current conveyed through the circuit component to the second node; and
wherein the first node produces the first drive voltage and the second node produces the second drive voltage.

15. The apparatus as in claim 14, wherein the differential trim signal includes a first trim current signal and a second trim current signal;
wherein the first drive voltage controls a magnitude of producing the first trim signal; and
wherein the second drive voltage controls a magnitude of producing the second trim signal.

16. The apparatus as in claim 1, wherein a magnitude of the differential trim signal is proportional to a magnitude of the first current outputted from the adjustable driver resource.

17. The apparatus as in claim 1, wherein the trim current generator includes a first switch and a second switch;
wherein control of the first switch via a first drive signal of the differential drive signal controls a magnitude of generating a first trim current signal of the differential trim signal; and
wherein control of the second switch via a second drive signal of the differential drive signal controls a magnitude of a second trim current signal of the differential trim signal.

18. The apparatus as in claim 1, wherein the differential trim signal includes a first trim current and a second trim current, both the first trim current and the second trim current derived from the second current.

19. The apparatus as in claim 18, wherein the differential drive signal includes a first drive voltage and a second drive voltage, the first drive voltage controlling a split of the second current into the first trim current and the second trim current.

20. The apparatus as in claim 19, wherein a magnitude of the second current is Ibias;
wherein the first trim current is equal to Ibias−Ioffset/2;

wherein the second trim current is equal to Ibias+Ioffset/2; and
wherein a magnitude of Ioffset varies depending on a magnitude of the differential drive signal.

21. An apparatus comprising:
an adjustable driver resource;
a differential voltage generator operable to produce a differential drive signal based on input received from the adjustable driver resource;
a trim current generator operable to derive a trim signal from the differential drive signal received from the differential voltage generator;
wherein the input received from the adjustable driver resource is an output current produced by the adjustable driver resource; and
wherein a magnitude of the output current over a range of different settings of the output current is K times greater than a magnitude of current provided by the trim signal, where K is a ratio value.

22. The apparatus as in claim 21, wherein K is a selected ratio value between 5 and 200.

23. A method comprising:
receiving an output signal, the output signal being first current outputted from an adjustable driver resource;
deriving a differential drive signal from the output signal;
generating a second current; and
via the second current, deriving a differential trim signal from the second current based on the differential drive signal.

24. The method as in claim 23,
wherein the differential drive signal is a voltage signal including a first drive voltage and a second drive voltage; and
wherein the differential trim signal includes a first trim current signal and a second trim current signal.

25. The method as in claim 24 further comprising:
inputting the first trim current signal to an inverting input node of an amplifier;
inputting the second trim current signal to a non-inverting input node of the amplifier; and
wherein input of the first trim current signal to the inverting input node of the amplifier and input of the second current trim signal to the non-inverting input node of the amplifier reduces an offset current error associated with the inverting input node and the non-inverting input node of the amplifier.

26. The method as in claim 23 further comprising:
controlling the adjustable driver resource to produce the first current, the adjustable driver resource being a digital-to-analog converter.

27. The method as in claim 23,
wherein deriving the differential drive signal includes passing the current outputted from the adjustable current driver resource through a first resistor.

28. The method as in claim 27, wherein generating the differential trim signal includes:
via the differential drive signal: i) controlling current through a second resistor to produce a first trim signal of the differential trim signal, and ii) controlling current through a third resistor to produce a second trim signal of the differential trim signal.

29. The method as in claim 23, wherein deriving the differential trim signal includes:
in a first mode: controlling a network of switches to: i) input a first drive signal of the differential drive signal to a first control element that produces a first trim signal of the differential trim signal, and ii) input a second drive signal of the differential drive signal to a second control element that produces a second trim signal of the differential trim signal; and in a second mode: controlling the network of switches to: i) input the first drive signal of the differential drive signal to the second control element that produces the second trim signal of the differential trim signal, and ii) input the second drive signal of the differential drive signal to the first control element that produces the first trim signal of the differential trim signal.

30. The method as in claim 23, wherein the differential trim signal includes a first trim current signal and a second trim current signal; and wherein a magnitude of a difference between the first trim current signal and the second trim current signal varies linearly as a function of a magnitude of the first current.

31. The method as in claim 23, wherein a magnitude of the first current is K times greater than the magnitude of average current provided by the differential trim signal, where K is a ratio value.

32. The method as in claim 31, wherein K is a selected ratio value between 3 and 500.

33. The method as in claim 23 further comprising:

offsetting the differential drive signal with respect to a reference voltage.

34. The method as in claim 23 further comprising:

while varying a magnitude of the current associated with the output signal, monitoring an output voltage of an electronic circuit to which the differential trim signal is applied.

* * * * *